United States Patent [19]
Egawa et al.

[11] Patent Number: 5,438,214
[45] Date of Patent: Aug. 1, 1995

[54] METAL OXIDE SEMICONDUCTOR DEVICE HAVING A COMMON GATE ELECTRODE FOR N AND P CHANNEL MOS TRANSISTORS

[75] Inventors: Yuichi Egawa; Yasuo Sato, both of Sagamihara, Japan

[73] Assignee: Nippon Steel Corporation, Tokyo, Japan

[21] Appl. No.: 258,351

[22] Filed: May 31, 1994

Related U.S. Application Data

[63] Continuation of Ser. No. 993,772, Dec. 21, 1992, abandoned.

[30] Foreign Application Priority Data

Dec. 20, 1991 [JP] Japan .................. 3-355793

[51] Int. Cl.⁶ .......................................... H01L 23/54
[52] U.S. Cl. ...................... 257/388; 257/754; 257/763; 257/412; 257/369
[58] Field of Search ............ 257/413, 378, 347, 370, 257/915, 382, 383, 388, 387, 389, 412, 763, 773; 251/369

[56] References Cited

U.S. PATENT DOCUMENTS

| | | | |
|---|---|---|---|
| Re. 34,158 | 1/1993 | Watanabe et al. | 257/376 |
| 5,190,886 | 3/1993 | Asahina | 257/413 |
| 5,218,232 | 6/1993 | Yuzurihara et al. | 257/388 |
| 5,268,590 | 10/1993 | Pfiester et al. | 257/915 |

*Primary Examiner*—Robert P. Limanek
*Assistant Examiner*—Alexander Oscar Williams
*Attorney, Agent, or Firm*—Pollock, Vande Sande & Priddy

[57] ABSTRACT

A semiconductor device and a method of fabricating the semiconductor device are disclosed in which the method comprises the steps of forming an insulating film for element-isolation and a gate insulating film on a surface of a semiconductor substrate, forming a semiconductor film on the element-isolation insulating film and the gate insulating film, removing a part of the semiconductor film corresponding to a boundary between a first region for formation of an N-channel transistor and a second region for formation of a P-channel transistor, introducing N type impurities into a part of the semiconductor film located on the first region and introducing P type impurities into a part of the semiconductor film located on the second region, forming a metallic film over the semiconductor film having the impurities introduced therein and the element-isolation insulating film, and patterning the metallic film and the semiconductor film into a pattern of a gate electrode common to the N-channel transistor and the P-channel transistor.

10 Claims, 3 Drawing Sheets

METAL OXIDE SEMICONDUCTOR DEVICE HAVING A COMMON GATE ELECTRODE FOR N AND P CHANNEL MOS TRANSISTORS

This application is a continuation of application Ser. No. 07/933,772 filed Dec. 21, 1992 now abandoned.

FIELD OF THE INVENTION

The present invention relates to a semiconductor device having a complementary metal oxide semiconductor (which will be referred to as CMOS, hereinafter) structure and a method of fabricating the semiconductor device.

BACKGROUND OF THE INVENTION

As the metal oxide semiconductor (which will be referred to as MOS, hereinafter) is made smaller, the short channel effect becomes stronger. One of the measures for weakening the short channel effect of the transistor, is to make a MOS transistor having a surface channel structure for the purpose of enhancing its controllability by gate voltage.

In order to provide both an N- and P-channel MOS transistors in a CMOS type semiconductor device with the surface channel structure, it is necessary to make the gate electrode of the N-channel MOS transistor in the form of an N type polycrystalline silicon (Si) film and to make the gate electrode of the P-channel MOS transistor in the form of a P type polycrystalline silicon film to thereby make the work functions of the gate electrodes of both MOS field effect transistor equal to each other.

However, in the case where it is desired to have a gate electrode 13 for an N-channel MOS transistor 11 and a P-channel MOS transistor 12 as shown in FIG. 4, if a part of the gate electrode 13 corresponding to the N-channel MOS transistor 11 is made of an N type polycrystalline silicon film, while another part of the gate electrode 13 corresponding to the P-channel MOS transistor 12 is made of a P-type polycrystalline silicon film as mentioned above, N- and P-type impurities are mutually diffused within the polycrystalline silicon films.

For this reason, when the distance between the N- and P-channel MOS transistors 11 and 12 is short, the mutual diffusion causes the threshold voltages of the MOS transistors 11 and 12 to be reduced.

SUMMARY OF THE INVENTION

It is an object of the present invention to provide and MOS type semiconductor device in which a common gate electrode is used for N- and P-channel MOS transistors, each having a surface channel structure, while preventing the threshold voltages thereof from being reduced, and to provide a method of fabricating the MOS type semiconductor device.

In accordance with an aspect of the present invention, the above object is attained by providing a MOS semiconductor device which comprises a semiconductor substrate having a region of a first conductivity type and a region of a second opposite conductivity type. An insulating film for element isolation is formed in a boundary region between the first and second conductivity type regions in a surface of the semiconductor substrate. A gate insulating film is formed in the surface of the semiconductor substrate contiguous to the element-isolation insulating film. The semiconductor regions formed in the first and second conductivity type regions of the semiconductor substrate are separated from each other by a separation region having a predetermined width on the element-isolation insulating film. The semiconductor regions are contiguous to the gate insulating film, and a metallic film is formed over the semiconductor region and the region separately the element-isolation insulating film. It is desirable that one of the semiconductor regions located on the first conductivity type region of the semiconductor substrate has a semiconductor characteristic of the second conductivity type and the other located on the second conductivity type region of the semiconductor substrate has a semiconductor characteristic of the first conductivity type. The metallic film perferably contains a refractory metal. The refractory metal is preferably tungsten. Further, the semiconductor regions preferably form parts of a gate electrode.

In accordance with another aspect of the invention, there is provided a MOS semiconductor device which comprises a semiconductor substrate having a region of a first conductivity type and a region of a second opposite conductivity type. An insulating film for element isolation is formed in a boundary region between the first and second conductivity type regions in a surface of the semiconductor substrate. A gate insulating film is formed in the surface of the semiconductor substrate contiguous to the element-isolation insulation film, and a semiconductor region of the second conductivity type is formed in the first conductivity type region of the semiconductor substrate contiguous to the gate insulating film. A semiconductor region of the first conductivity type is formed in the second conductivity type region of the semiconductor substrate contiguous to the gate insulating film and is separated from the second conductivity type semiconductor region by a separation region having a predetermined width on the element-isolation insulating film. A metallic film is formed on the semiconductor regions and the separation region. It is desirable that the metallic film contains a refractory metal. The refractory metal is preferably tungsten.

In accordance with a further aspect of the present invention, there is provided a method of fabricating a semiconductor device. An insulating film for element isolation and a gate insulating film are formed in a surface of a semiconductor substrate. A semiconductor film is formed on the element-isolation insulating film and the gate insulating film. A part of the semiconductor film corresponding to a boundary between a first region of the semiconductor substrate where an N-channel transistor is to be formed and a second region of the semiconductor substrate where a P-channel transistor is to be formed is removed. N-type impurities are introduced into a part of the semiconductor film located on the first region of the semiconductor substrate and introducing P-type impurities into a part of the semiconductor film located on the second region of the semiconductor substrate. A metallic film is formed on the semiconductor film having the impurities introduced therein and on the element-isolation insulating film. The metallic film and the semiconductor film are formed into a pattern of a, gate electrode for the N-channel transistor and the P-channel transistor. The removing step preferably includes a step of coating negative resist on the semiconductor film. The negative resist is exposed light through a phase shifter disposed correspondingly to a selected one of the first and second regions of the semiconductor substrate to remove a part of the negative resist corresponding to the boundary between the first and second regions on the element-isolation insulating film. The semiconductor film is patterned by using the negative resist, of which the part is removed, as a mask.

With the above arrangement of the present invention, since N and P type impurities are prevented from being mutually diffused into the semiconductor film forming the gate electrode common to the N- and P-channel transistors, it is possible to provide a semiconductor device without lowering the threshold voltage.

In addition, even when the width of an insulating film for element-isolation on the boundary between the first and second regions is narrow, the parts of the semiconductor film can be separated from each other to provide a fine semiconductor device.

DESCRIPTION OF THE PREFERRED EMBODIMENTS

An embodiment of the present invention will be explained by referring to the accompanying drawings.

Figure 1A:
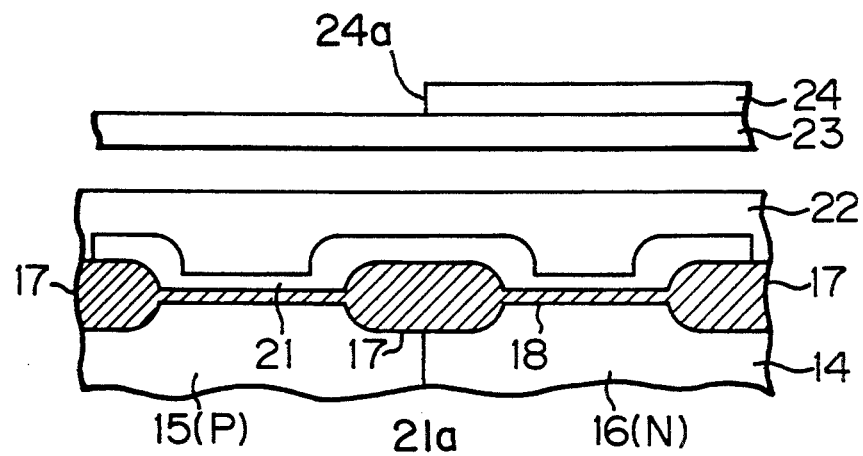
FIGS. 1A to 1D are enlarged sectional side elevations showing respective steps, in that order, of a method of fabricating a semiconductor device in accordance with one embodiment of the present invention.

In the present embodiment, as shown in FIG. 1A, an N well 16 is formed in a region of a P-type silicon substrate 14 where an N-channel MOS transistor 11 is to be formed. An $SiO_2$ insulation film 17 for element-isolation is formed in a surface of the Si substrate 14 by a local oxidation of silicon (LOCOS) process and then an $SiO_2$ gate insulating film 18 is formed by a thermal oxidation method.

Thereafter, a polycrystalline silicon film 21 is deposited all over the $SiO_2$ film 18 by a chemical vapor deposition (CVD) method, and a negative resist 22 is coated on the polycrystalline silicon film 21. The negative resist 22 is then subjected to a light exposure through a glass plate 23 and a phase shifter 24 provided on the glass plate 23 at its portion corresponding to the N well 16. The glass plate has a thickness of about 2 mm and the phase shifter is made of $SiO_2$ covering the portion of glass plate at a thickness of, for example, 500 to 600 nm.

Light is transmitted through both of the glass plate 23 and phase shifter 24. Accordingly, the negative resist 22 is subjected to the exposure of light passing through the both glass plate 23 and phase shifter 24 and of light passing through the glass plate 23 alone.

The light passed through the both glass plate 23 and phase shifter 24 is subjected to a phase shift with respect to the light passed through the glass plate 23 alone. For this reason, at an area in the vicinity of an end edge 24a of the phase shifter 24, the light transmitted through the both glass plate 23 and phase shifter 24 and the light transmitted through only the glass plate 23 interfere and thus the intensity of the light is reduced at the area.

As a result, bridging reaction does not occur sufficiently in the part of the negative resist 22 close to the end edge 24a of the phase shifter 24, that is, in the part of the negative resist 22 corresponding to a boundary between the P region 15 and the N well 16 and above the $SiO_2$ film 17. Thus, the bridging density at the part does not become so high as to make the part of the resist insoluble in solvent.

Figure 1B:
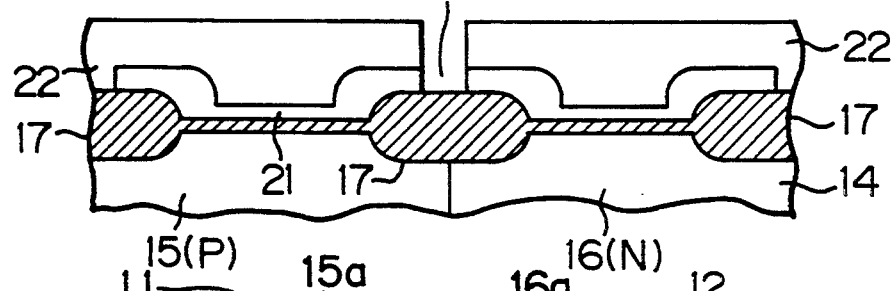

Thus, when the negative resist 22 is developed, only the part of the $SiO_2$ film 17 corresponding to the boundary between the P region 15 and N well 16 is removed as shown in FIG. 1B. Thereafter, the film 21 is subjected to an anisotropic etching by using the negative resist 22 as a mask, so that the polycrystalline silicon film 21 is separated by a width of about 0.4 $\mu m$ into two parts on the $SiO_2$ film 17 which are located above the P region 15 and above the N well 16, respectively.

Figure 1C:
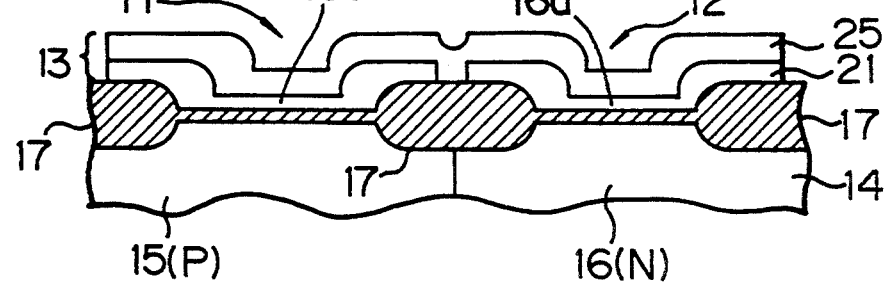
Figure 2:
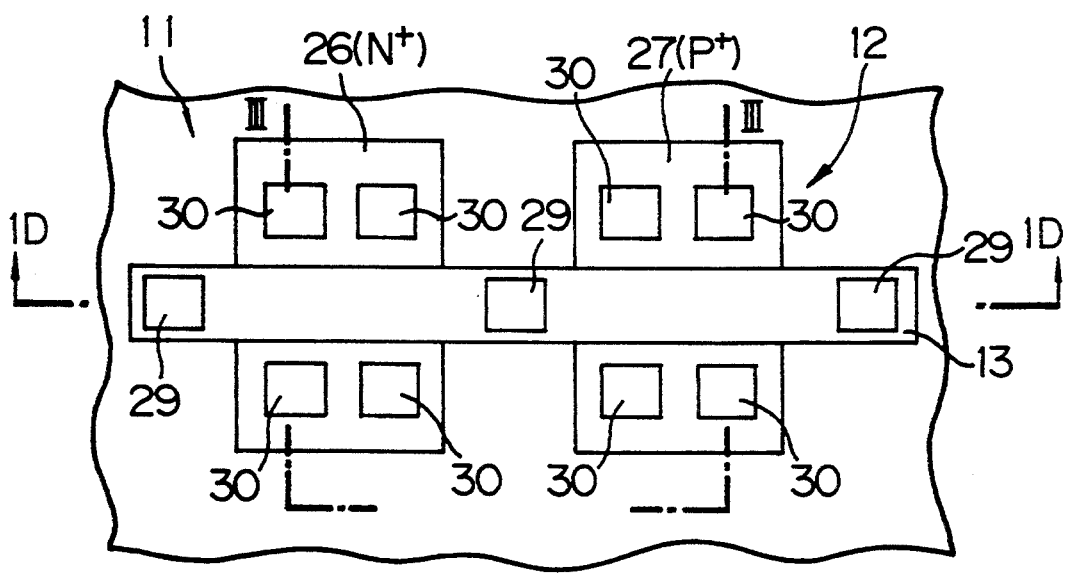
FIG. 2 is a plan view of a semiconductor device obtained according to the steps of FIG. 1D.

Next, as shown in FIG. 1C, the negative resist 22 is removed and N-type impurities are doped or introduced into a region 15a of the polycrystalline silicon film 21 located above the P region 15, while P-type impurities are introduced into a region 16a of the film 21 located above the N well 16. A metallic film 25 made of a refractory metal such as tungsten (W) or a refractory metal silicide film 25 is formed all over the polycrystalline silicon film 21, and as shown in FIG. 2, the metallic film 25 and polycrystalline silicon film 21 are patterned into a pattern of a gate electrode 13 common to the N- and P-channel MOS transistors 11 and 12. Accordingly, the gate electrode 13 has a polycide structure which is made of the polycrystalline silicon film 21 and the metallic or metal silicide film 25.

After this, by using a resist (not shown), gate electrode 13 and $SiO_2$ film 17 which cover the region of the N well 16 as a mask, N type impurities are introduced into an active area of the P region 15 to form an N+ layer 26 as source and drain of the N-channel MOS transistor 11. Similarly, by using a resist (not shown), gate electrode 13 and $SiO_2$ film 17 which cover the P region 15 as a mask, P type impurities are introduced into an active region of the N well 16 to form an P+ layer 27 as source and drain of the P-channel MOS transistor 12.

Figure 1D:
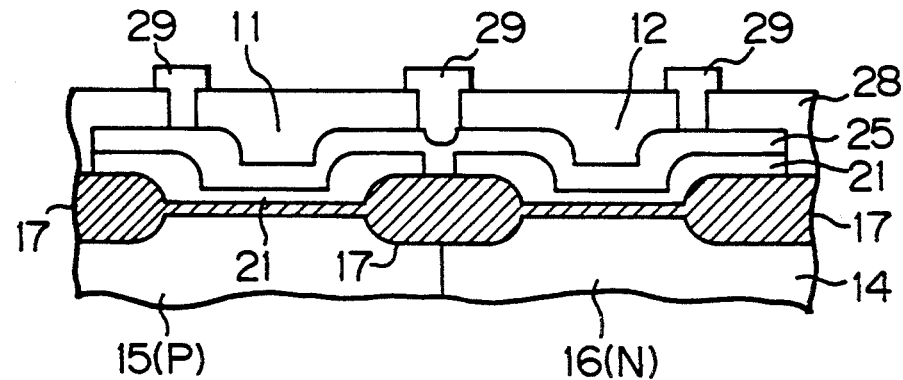
Figure 3:
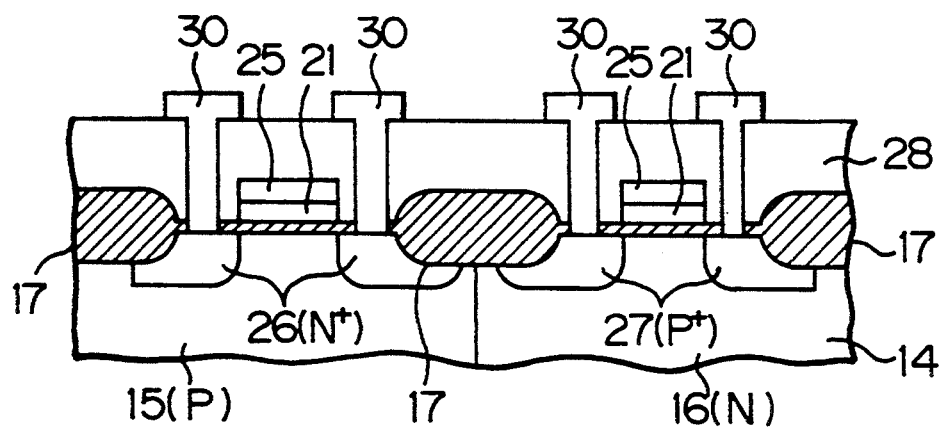
FIG. 3 is a cross-sectional view taken along line III—III in FIG. 2.
Figure 4:
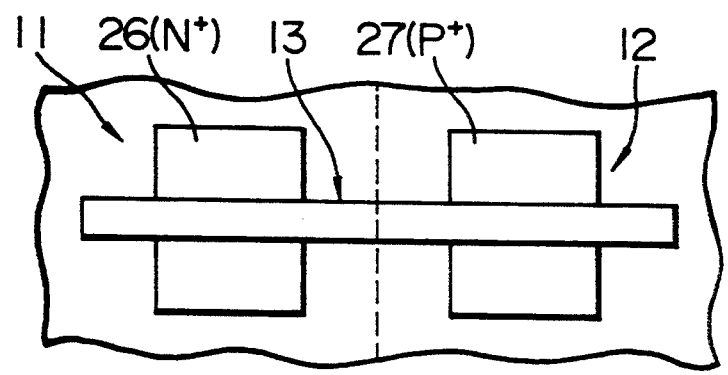
FIG. 4 is a plan view of a prior art semiconductor device.

Then, as shown in FIG. 1D, after forming an interlayer insulating film 28, lead electrodes 29 connected to the respective gates are formed to extend externally and also drain and source electrodes 30 as shown in FIG. 3 are formed to extend externally. Thus, a semiconductor device according to the present invention is obtained. FIG. 2 shows a plan view of the semiconductor device thus obtained and FIG. 1D is a cross-sectional view taken along line 1D—1D in FIG. 2 and FIG. 3 is a cross-sectional view taken along line III—III in FIG. 2.

In the embodiment as mentioned above, the gate electrode 13 is commonly used to the N- and P-channel MOS transistors 11 and 12, but the polycrystalline silicon film 21 of the gate electrode 13 having the polycide structure is separated into two parts, one located above the P region 15 and the other located above the N well 16. For this reason, N type impurities doped in the one part of the polycrystalline silicon film 21 located above the P region 15 and P type impurities doped into the other part of the film 21 located above the N well 16 are not mutually diffused into the polycrystalline silicon film 21. Accordingly, the threshold voltage of the N- and P-channel MOS transistors 11 and 12 are not reduced.

In addition, since a phase shift process is employed to separate the polycrystalline silicon film 21 into the two parts, respectively, located above the P region 15 and N well 16, the separation can be realized with a gap of narrow width of about 0.4 $\mu m$ as mentioned above. Therefore, a distance between the N+ and P+ layers 26 and 27 can be made short, that is, the width of the SiO$_2$ film 17 can be made narrow, whereby a fine CMOS transistor can be manufactured.

What is claimed is:

1. A Metal Oxide Semiconductor device comprising:
    a semiconductor substrate having a region of a first conductivity type and a region of a second opposite conductivity type;
    an element-isolation insulating film formed at a boundary region between said first and second conductivity type regions in a surface of said semiconductor substrate;
    a gate insulating film formed on the surface of said semiconductor substrate contiguous to said element-isolation insulating film;
    a semiconductor film having first and second semiconductor regions formed above said first and second conductivity type regions of said semiconductor substrate, respectively, and a separation region by which said first and second semiconductor regions are separated from each other, said separation region having a predetermined width and disposed above said element-isolation insulating film for reducing diffusion of N and P impurities into said first and second semiconductor regions, said first and second semiconductor regions being contiguous to said gate insulating film; and
    a continuous metallic film formed on said semiconductor film and having substantially the same pattern as that of said semiconductor film, said metallic film being formed directly on said first and second semiconductor regions of said semiconductor film so that said metallic film is electrically connected to said first and second semiconductor regions.

2. A MOS metal oxide semiconductor device according to claim 1, wherein said first semiconductor region has a semiconductor characteristic of the second conductivity type and said second semiconductor region has a semiconductor characteristic of the first conductivity type.

3. A metal oxide semiconductor device according to claim 1, wherein said metallic film contains a refractory metal.

4. A metal oxide semiconductor device according to claim 3, wherein said refractory metal contains tungsten.

5. A MOS semiconductor device according to claim 1, wherein impurities are introduced into each of said first and second semiconductor regions which provides a gate electrode formed on a corresponding one of said first and second conductivity type regions in combination with said metallic film.

6. A metal oxide semiconductor device comprising:
    a semiconductor substrate having a region of a first conductivity type and a region of a second opposite conductivity type;
    an element-isolation insulating film formed at a boundary region between said first and second conductivity type regions in a surface of said semiconductor substrate;
    a gate insulating film provided on the surface of said semiconductor substrate contiguous to said element-isolation insulating film;
    a semiconductor film having a first semiconductor region of the second conductivity type formed above the first conductivity type region of said semiconductor substrate, a second semiconductor region of the first conductivity type formed above the second conductivity type region of said semiconductor substrate, and a separation region by which said first and second semiconductor regions are separated from each other for reducing diffusion of N and P type impurities into said first and second semiconductor regions, said first and second semiconductor regions being contiguous to said gate insulating film and said separation region having a predetermined width and disposed on the element-isolation insulating film; and
    a continuous metallic film formed on said semiconductor film, having substantially the same pattern as that of said semiconductor film, said continuous metallic film being formed directly on said first and second semiconductor regions of said semiconductor film so that said continuous metallic film is electrically connected to said first and second semiconductor regions.

7. A metal oxide semiconductor device according to claim 6, wherein said continuous metallic film contains a refractory metal.

8. A metal oxide semiconductor device according to claim 7, wherein said refractory metal contains tungsten.

9. An metal oxide semiconductor device according to claim 1, wherein a lower surface of said metallic film is in direct contact with respective upper surfaces of said first and second semiconductor regions of said semiconductor film.

10. An metal oxide semiconductor device according to claim 6, wherein a lower surface of said continuous metallic film is in direct contact with respective upper surfaces of said first and second semiconductor regions of said semiconductor film.

* * * * *